(12) United States Patent
Kang et al.

(10) Patent No.: US 6,411,508 B1
(45) Date of Patent: Jun. 25, 2002

(54) FOAM METAL HEAT SINK

(75) Inventors: Byung Ha Kang; Seo Young Kim; Jin Wook Pack, all of Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 09/640,206

(22) Filed: Aug. 16, 2000

(30) Foreign Application Priority Data

Jan. 29, 2000 (KR) .......................................... 2000-4481

(51) Int. Cl.[7] ................................................. H05K 7/20
(52) U.S. Cl. ..................... 361/695; 165/80.2; 165/80.3; 165/185; 165/907; 361/704
(58) Field of Search ............................ 165/80.2, 80.3, 165/185, 907; 174/16.3; 257/706–707, 712–713, 717; 361/688, 690, 694, 695, 704–710, 717, 722

(56) References Cited

U.S. PATENT DOCUMENTS

| 4,602,314 A | * | 7/1986 | Broadbent | ................... 361/704 |
|---|---|---|---|---|
| 5,402,004 A | * | 3/1995 | Ozmat | ........................ 257/717 |
| 5,459,352 A | * | 10/1995 | Layton et al. | ............... 257/713 |
| 5,986,885 A | * | 11/1999 | Wyland | ........................ 361/704 |
| 6,196,307 B1 | * | 3/2001 | Ozmat | ......................... 165/185 |

OTHER PUBLICATIONS

KSME 99 TE121, Heat Transfer Characteristics of Aluminum Foam Heat Sink, pp. 739–744, Sep. 11, 1999.
HTD–vol. 319/EEP–vol. 15, Cooling and Thermal Design of Electronic Systems, pp. 67–75, ASME 1995.
Heat Mass Transfer, No. 4, vol. 36, Air Jet Impingement Heat Transfer From Modified Surfaces, 1993.
Heat Transfer 1998, Optimization of Vertical Pin–Fin Heat Sinks in Natural Convective Heat Transfer, (pp. 50–506) Proceedings of 11th IHTC, vol. 3.

* cited by examiner

*Primary Examiner*—Gregory Thompson
(74) *Attorney, Agent, or Firm*—Darby & Darby

(57) ABSTRACT

The present invention relates to a heat sink, and in particular to a light foam metal heat sink which is capable of significantly enhancing a foam metal heat sink performance. In the present invention, there is provided a foam metal heat sink installed at an outer portion of a heat generating unit of an equipment, which heat sink includes a metal plate installed at an outer portion of the heat generating unit of the equipment, and a foam metal welded to the metal plate and having a plurality of foams.

9 Claims, 4 Drawing Sheets

FOAM METAL HEAT SINK

BACKGROUND OF THE INVENTION

1. Field of the Invention

The present invention relates to a foam metal heat sink, and in particular to a light foam metal heat sink which is capable of significantly enhancing the performance of a heat sink.

2. Description of the Background Art

In an electronic equipment such as a computer, medical equipment or a compact sized military radar system, a laser system, a communication equipment, etc. which each generate a high heat flux and have a high density and are highly integrated, an over heating problem of the equipment and a cooling method of the over heated equipment are important factors for designing the electronic equipment and operation of the same. Therefore, various kinds of heat sinks are being used in the industry for an inherent purpose of the equipment.

As shown in FIG. 1, as one of the conventional heat sinks, an aluminum heat sink of a pin fin type or a rectangular fin type is known. However, there are many problems for fabricating the above-described heat sink because the fabrication process is very complicated, and the conventional heat sink does not have a larger heat transferring area.

In addition, in the conventional heat sink, the weight based on the unit volume is heavy, the entire weight of the conventional heat sink is increased, and it is impossible to obtain a good heat sink performance.

In particular, in the advanced electronic equipment which becomes highly integrated and compact sized, the above-described conventional heat sink is not proper. Therefore, the need for more reliable and compact sized heat sink having a high efficiency is being increased in the industry.

SUMMARY OF THE INVENTION

Accordingly, it is an object of the present invention to provide a heat sink which overcomes the problems encountered in the conventional heat sink and is capable of significantly enhancing a heat sink performance compared to the conventional heat sink and implementing a simple construction and an easier fabrication.

It is another object of the present invention to provide a lighter heat sink fabricated by decreasing the entire weight and required volume of the equipment for thereby implementing a highly integrated and compact sized equipment.

It is still another object of the present invention to provide a heat sink which is easily and quickly installed at an existing equipment.

To achieve the above objects, there is provided a foam metal heat sink installed at an outer portion of a heat generating unit of an equipment, which heat sink includes a metal plate installed at an outer portion of the heat generating unit of the equipment, and a foam metal attached to the metal plate and having a plurality of foams.

It is also possible to use a foam metal heat sink installed directly on an outer portion of a heat generating unit of an equipment, although in that case heat sink performance is a little low than the case of combination with a metal plate.

The metal plate and foam metal can be bonded by a brazing method.

The metal plate and foam metal can be bonded by an ultrasonic spot welding method.

The metal plate and foam metal can be bonded using a metallic adhesive.

The foam metal and metal plate are formed of aluminum or an aluminum alloy.

The foam metal and metal plate can also be formed of copper.

The metal plate may operate as an outer casing of a heat generating unit.

In another embodiment of the present invention, a fan is further provided for generating a certain flow flux of a surrounding air.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

The embodiments of the present invention will be explained with reference to the accompanying drawings.

Figure 1:
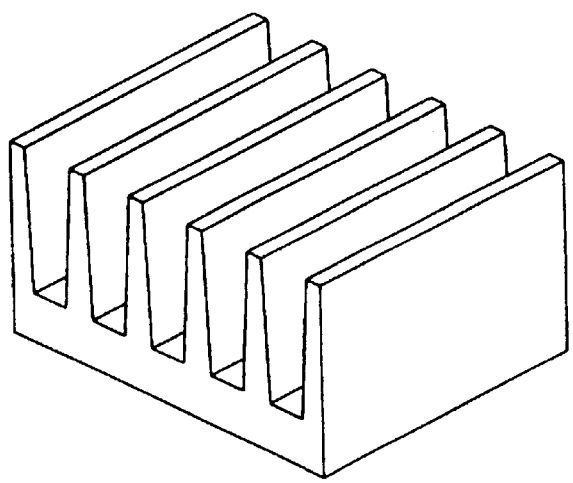
FIG. 1 is a perspective view illustrating a conventional heat sink.
Figure 2:
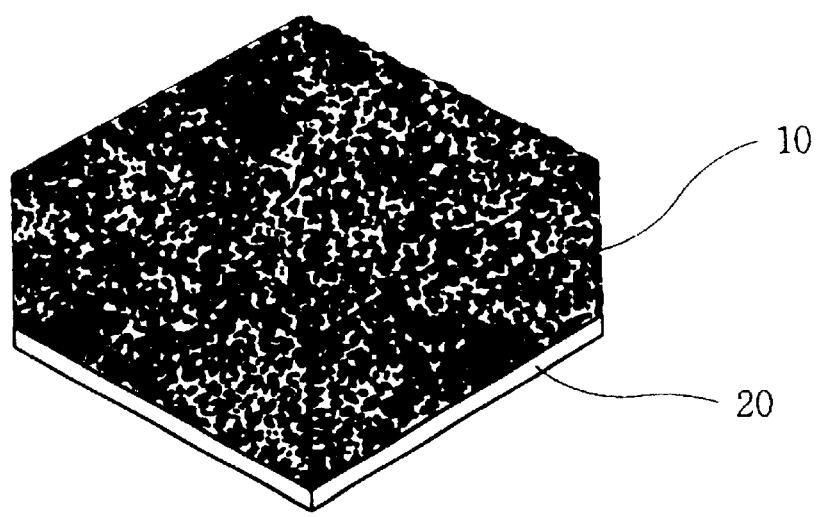
FIG. 2 is a perspective view illustrating the construction of a foam metal heat sink according to the present invention.

FIG. 2 is a perspective view illustrating the construction of a foam metal heat sink according to the present invention. A foam metal 10 is fabricated either by blowing foams into a melted metal for thereby forming foams therein and then hardening the same or by stacking synthetic resin particles each having a certain size and then injecting melted metal into between the particles and then hardening the same and finally removing the synthetic resin. The thusly-fabricated metal 10 has an excellent mechanical strength and workability.

As shown in FIG. 2, the foam metal 10 is welded to a metal plate 20 for thereby fabricating a heat sink. Since foams are formed within the foam metal 10, and the volume of the foams is large, the unit volume-based surface area of the foam metal is great, and the unit volume-based weight is decreased. Therefore, an effective heat transfer is implemented due to the increase of the unit volume-based surface area, and a small and light product is implemented. As shown in FIG. 2, the foam metal 10 has a rectangular cubic shape. The shape of the foam metal 10 is not limited thereto. Various shapes of the foam metal 10 may be possible.

FIGS. 3 through 6 illustrate embodiments that the foam metal heat sink according to the present invention is adapted to a heating member such as an electronic device which generates a large amount of heat like a transistor or CPU of an electronic equipment or a heating member like a power supply unit.

Figure 3:
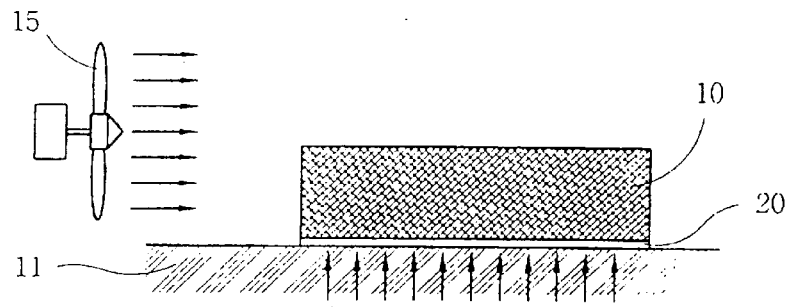
FIG. 3 is a view illustrating a foam metal heat sink according to one embodiment of the present invention.

FIG. 3 illustrates a state that heat from heat generating wall 11 is dissipated by means of a foam aluminum heat sink 10 and 20 with a natural air circulation or a forced air circulation using a fan 15 installed at one side position.

Figure 4:
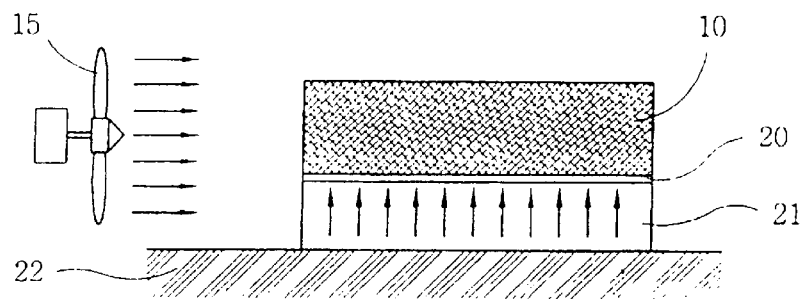
FIG. 4 is a view illustrating a foam metal heat sink according to another embodiment of the present invention.

FIG. 4 illustrates a state that a generated heat is transferred and is radiated to the outside by engaging the foam metal heat sinks 10 and 20 at a heat generating electronic device 21 like CPU, etc. mounted on a PCB(Printed circuit Board) 22. In this case, air sucked by a natural air circulation or air sucked or discharged by the fan 15 flows in a direction parallel to the heat generating member.

Figure 5:
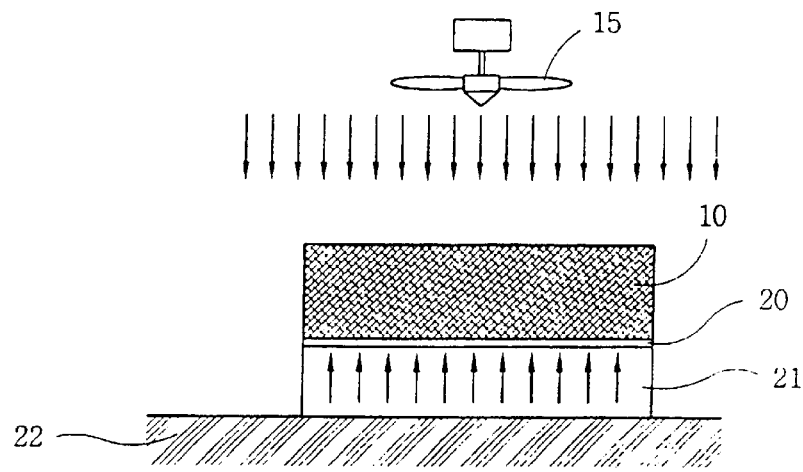
FIG. 5 is a view illustrating a foam metal heat sink according to still another embodiment of the present invention.

FIG. 5 illustrates a state that a generated heat is transferred and is radiated to the outside by engaging the foam aluminum heat sinks 10 and 20 at a heat generating electronic device 21 like CPU mounted on a PCB 22. In this case, air flown by the fan 15 from the upper portion collides in a vertical direction, and the heat of the heat-generating member is dissipated to the lateral side of the heat sink.

Figure 6:
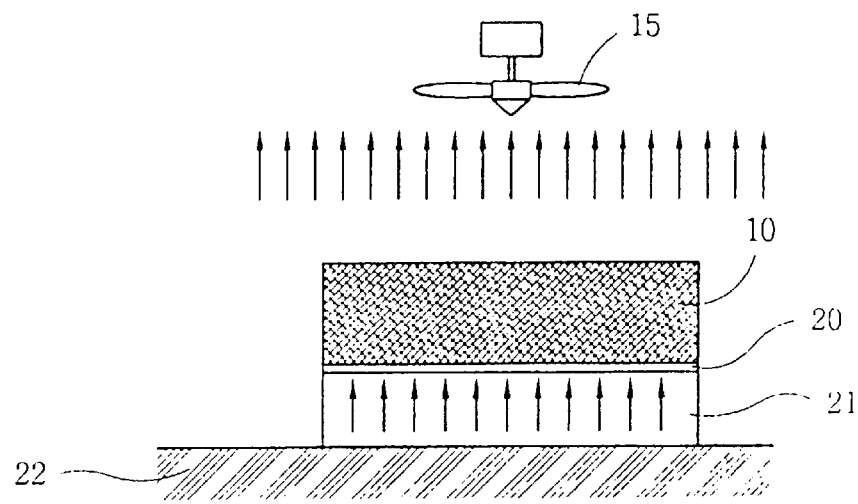
FIG. 6 is a view illustrating a foam metal heat sink according to further still another embodiment of the present invention.

FIG. 6 illustrates a state that the heat of the heat generating member is radiated to the upper portion through the fan 15 based on the flow of air sucked from the lateral side of the heat sink by the fan 15.

Figure 7:
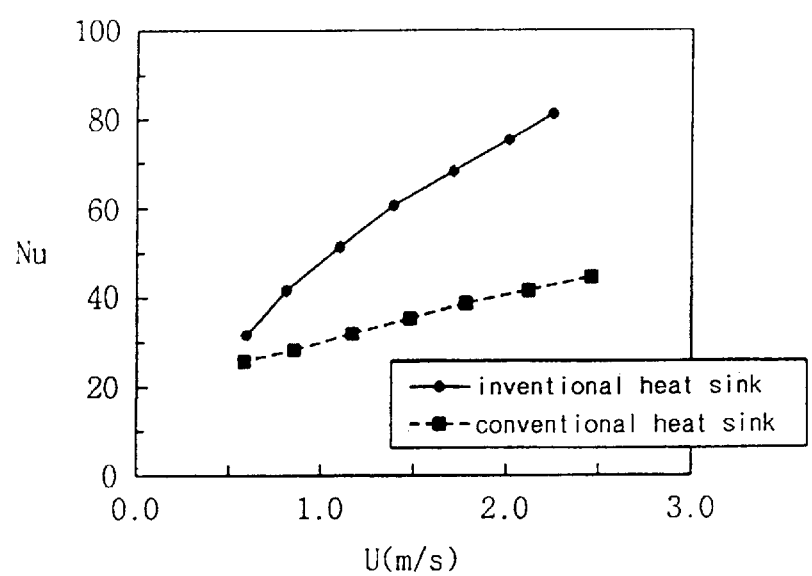
FIG. 7 is a graph of a compared performance of a heat sink between a conventional heat sink and a foam metal heat sink of FIG. 3 by varying the flowing speed of air.
Figure 8:
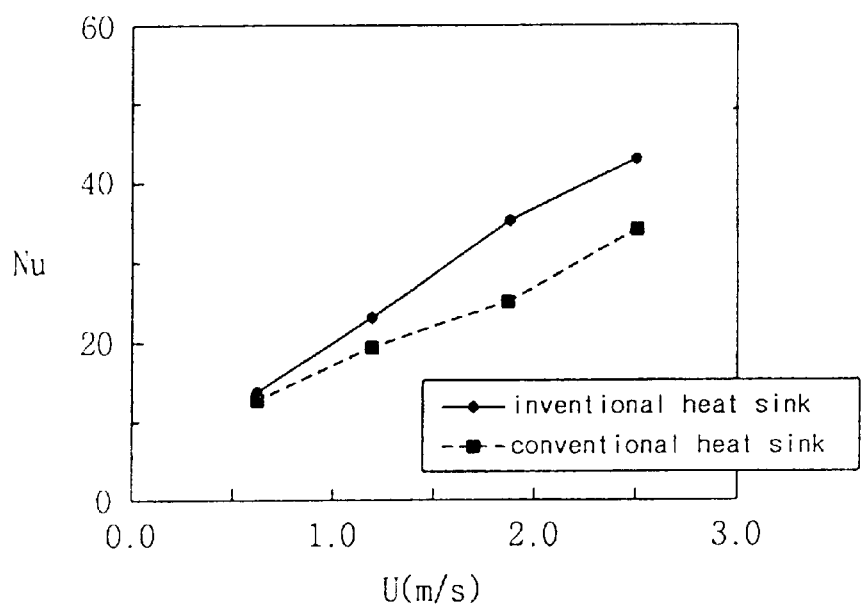
FIG. 8 is a graph of a compared performance of a heat sink between a conventional heat sink and a foam metal heat sink of FIG. 5 by varying the flowing speed of air.

FIGS. 7 and 8 illustrate the graphs of a heat sink performance between the conventional heat sink and the foam aluminum heat sink according to the present invention.

FIG. 7 is a graph of a heat sink performance between the conventional heat sink and the foam aluminum heat sink based on the same flowing condition by changing the flowing speed U of air.

In this case, the foam aluminum heat sink according to the present invention includes a foam aluminum 10 having a height of 10 mm, a width of 90 mm and a length of 30 mm and a metal plate 20 having a thickness of 1.0 mm.

The conventional heat sink has a height of 10 mm, a width of 90 mm, a length of 30 mm, and a bottom part thickness of 1.0 mm. Namely, the conventional heat sink has the same dimension as the foam aluminum heat sink according to the present invention.

Here, the foam aluminum is formed of aluminum or an aluminum alloy having a heat conductivity of more than 100 W/mk and is formed of foam material having a porosity of more than 88%.

The heat sink performance of the heat sink may be expressed as the following Equation 1 based on Nusselt number $\overline{Nu}$ which is a non-dimensional number.

$$\overline{Nu} = \frac{q''H/k}{Tw-Ti} \quad \text{[Equation 1]}$$

Where q" represents quantity of heat per unit area, H represents height of a heat sink, k represents thermal conductivity of air, Tw represents average temperature of a heat sink, and Ti represents average temperature of external air.

Therefore, as the value $\overline{Nu}$ is increased, the surface temperature of the heat sink is decreased. It means the heat sink performance is good. In the present invention, the heat sink performance is increased by 25~100% compared to the heat sink performance of the conventional heat sink. In addition, the weight of the heat sink according to the present invention is 25% of that of the conventional heat sink.

FIG. 8 is a graph illustrating a heat sink performance between the conventional heat sink and a foam aluminum heat sink according to the present invention, which is obtained based on the same flowing condition as the embodiment of FIG. 5.

In this embodiment, the foam aluminum heat sink according to the present invention includes a foam aluminum 10 having a height of 10 mm, a width of 40 mm, and a length of 40 mm and a metal plate 20 having a thickness of 1.0 mm. The conventional heat sink has a height of 10 mm, a width of 40 mm, a length of 40 mm, and a bottom part thickness of 1.0 mm. Namely, the conventional heat sink has the same dimension as the foam aluminum heat sink according to the present invention.

When comparing the heat sink performance between the conventional heat sink and the foam aluminum heat sink in the same manner as FIG. 8, in the present invention, the heat sink performance is increased by 10~25%. The weight of the heat sink is 25% of that of the conventional heat sink.

As described above, in the present invention, it is possible to provide a heat sink which is capable of significantly enhancing heat sink performance and implementing a simple construction and easier fabrication. In addition, in the present invention, a compact sized and light heat sink is provided by decreasing the entire weight and required volume of the heat sink, so that it is possible to implement a highly integrated and small sized and light system. Furthermore, the foam aluminum heat sink according to the present invention may be easily installed at an existing equipment easily and quickly.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A heat sink system comprising:

a device having a heat generating unit;

a metal plate having one surface attached to an outer portion of the heat generating unit;

a foam metal on the other surface of the metal plate and having a plurality of pores; and a fan positioned relative to the upper surface of the foam metal for generating an air flow from the fan to the upper surface of the foam metal.

2. The heat sink of claim 1, wherein said foam metal and metal plate are formed of aluminum or an aluminum alloy.

3. The heat sink of claim 1, wherein said foam metal and metal plate are formed of copper.

4. The heat sink of claim 1, wherein said metal plate and foam metal are bonded using a blazing method.

5. The heat sink of claim 1, wherein said metal plate and foam metal are bonded using an ultrasonic spot welding method.

6. The heat sink of claim 1, wherein said metal plate and foam metal are bonded using a metallic adhesive.

7. The heat sink of claim 2, wherein said aluminum or aluminum alloy has a heat conductivity of more than 100 W/mk and a porosity of more than 88%.

8. A heat sink system as in claim 1 wherein the fan forces air into the foam metal through the foam metal upper surface to cause heat to be forced out of the sides of the foam metal.

9. A heat sink system as in claim 1 wherein the fan air flow draws heat from the foam metal through the foam metal upper surface.

* * * * *